(12) United States Patent
Sudharsanan et al.

(10) Patent No.: US 6,255,708 B1
(45) Date of Patent: Jul. 3, 2001

(54) SEMICONDUCTOR P-I-N DETECTOR

(76) Inventors: Rengarajan Sudharsanan, 53 Timber Line Dr., Nashua, NH (US) 03062; Nasser H. Karam, 577 Lowell St., Lexington, MA (US) 02173

( * ) Notice: Subject to any disclaimer, the term of this patent is extended or adjusted under 35 U.S.C. 154(b) by 0 days.

(21) Appl. No.: 08/949,015

(22) Filed: Oct. 10, 1997

(Under 37 CFR 1.47)

(51) Int. Cl.$^7$ .................................................. H01L 31/00
(52) U.S. Cl. ...................... 257/428; 257/441; 257/442; 257/458; 250/370.09; 250/370.12; 250/370.13; 250/370.14
(58) Field of Search ................................ 257/441, 442, 257/458, 428; 250/370.13, 370.14, 370.09, 370.12

(56) References Cited

U.S. PATENT DOCUMENTS

| | | | |
|---|---|---|---|
| 4,977,097 | 12/1990 | Meyers et al. | 437/4 |
| 5,117,114 | * 5/1992 | Street et al. | 250/370.11 |
| 5,391,882 | 2/1995 | Rhiger | 250/370.13 |
| 5,512,756 | * 4/1996 | Bayer et al. | 250/370.13 |
| 5,528,495 | 6/1996 | Roscoe | 364/422 |
| 5,616,925 | * 4/1997 | Rhiger et al. | 250/370.13 |
| 5,627,377 | * 5/1997 | Hamilton, Jr. et al. | 250/370.13 |

OTHER PUBLICATIONS

Åbro, E. and Johansen, G.A., "Low Noise Gamma–ray and X–ray Detectors Based on CdTe–materials," *Nuclear Instruments and Methods in Physics Research*, vol. A 377, 470–4 (1996).

Butler, J.F. et al., "$Cd_{1-x}Zn_xTe$ Gamma Ray Detectors," *IEEE Transactions on Nuclear Science*, vol. 39, No. 4, 605–9 (1992).

Hazlett, T. et al., "Large, High Resolution CdTe Gamma Ray Sensors," *IEEE Transactions on Nuclear Science*, vol. 33, No. 1, 332–5 (1986).

Parnham, K., "Recent Progress in $Cd_{1-x}Zn_xTe$ Radiation Detectors," *Nuclear Instruments and Methods in Physics Research*, vol. A 377, 487–91 (1996).

Ryan, F.J. et al., "Gamma Ray Detectors with HgCdTe Contact Layers," *Appl. Phys. Lett.*, vol. 46, No. 3, 274–6 (1985).

* cited by examiner

Primary Examiner—William Mintel
(74) Attorney, Agent, or Firm—Thomas J. Engellenner; Scott D. Rothenberger; Nutter, McClennen & Fish, LLP

(57) ABSTRACT

A semiconductor P-I-N detector including an intrinsic wafer, a P-doped layer, an N-doped layer, and a boundary layer for reducing the diffusion of dopants into the intrinsic wafer. The boundary layer is positioned between one of the doped regions and the intrinsic wafer. The intrinsic wafer can be composed of CdZnTe or CdTe, the P-doped layer can be composed of ZnTe doped with copper, and the N-doped layer can be composed of CdS doped with indium. The boundary layers is formed of an undoped semiconductor material. The boundary layer can be deposited onto the underlying intrinsic wafer. The doped regions are then typically formed by a deposition process or by doping a section of the deposited boundary layer.

14 Claims, 5 Drawing Sheets

SEMICONDUCTOR P-I-N DETECTOR

This invention was made with Government's support under Grant No. DE-FG02-94ER81869 awarded by The Department of Energy. The Government has certain rights in this invention.

FIELD OF THE INVENTION

The present invention relates to the detection of high energy radiation, such as gamma rays and x-rays, by a semiconductor detector and also concerns the methods for fabricating the semiconductor radiation detector. More particularly, the invention concerns semiconductor detectors having a P-type layer/Intrinsic layer/N-type layer (hereinafter "P-I-N") structure.

BACKGROUND OF THE INVENTION

High energy semiconductor radiation detectors provide detection of gamma rays and x-rays in numerous fields including nuclear instrumentation, medical imaging, biological research, astronomy, and dosimetry. However, known high energy scintillator-based detectors fail to provide acceptable energy resolution while operating at room temperature. For instance, the known high energy detectors are ill-suited for use in gamma ray spectrometers operating at room temperature.

Currently available Metal-Semiconductor-Metal (hereinafter "MSM") devices have proven useful for several spectroscopic applications. MSM detectors tend to have reasonably good energy resolution, typically 5% at 120 keV at room temperature. However, MSM detectors suffer from particular drawbacks. For instance, MSM detectors lack the energy resolution necessary to meet the requirements for spectroscopic applications. Additionally, the known MSM detectors are severely limited by their high inter pixel leakage current.

Others have attempted to overcome the drawbacks associated with MSM detectors by either increasing the bias voltage applied across the detectors or by cooling the detectors to a temperature less than $-30°$ C. Increasing the bias voltage across the MSM detectors, however, increases the leakage current through the detectors. The increased leakage current degrades the energy resolution of the detector. Additionally, cooling the MSM detectors, especially large arrays of detectors, proves to be problematic because of the quantities of power consumed to cool the detectors. An alternative to the MSM detector is the P-I-N detector.

The P-I-N design can offer low leakage current at large bias voltages, relative to MSM detectors. A basic P-I-N semiconductor radiation detector includes a wafer of intrinsic material with doped contacts formed on the opposite surfaces of the intrinsic layer. A reverse biasing electric field is applied across the contacts. High energy radiation, such as gamma rays, passing through the wafer of intrinsic material liberate electron-hole pairs which are swept to the respective contacts by the electric field and generate electrical pulses in an associated electronic unit.

Rhiger, U.S. Pat. No. 5,391,882, discloses a P-I-N type gamma ray detector having an intrinsic layer formed of cadmium telluride (CdTe) or cadmium zinc telluride (CdZnTe). The P-type and N-type semiconductor layers are formed of mercury cadmium telluride (HgCdTe). The intrinsic layer is a wide bandgap semiconductor detector layer, and the doped layers are graded such that the bandgap of the doped layers decreases with distance from the intrinsic layer.

The P-I-N detector disclosed in the Rhiger Patent is manufactured by growing a CdZnTe substrate and then forming HgCdTe layers by liquid phase epitaxially growth techniques. Even though this approach produces gamma ray detectors having higher energy resolution than MSM detectors, the fabrication method is expensive and is not useful for High Pressure Bridgman (HPB) CdZnTe because of the high temperatures used during the liquid phase epitaxially growth phase. Several researchers have observed that high temperatures (greater than 150 degrees C or perhaps lower, depending on the anneal time) severely degrade the resistivity and detector properties of HPB CdZnTe. Since liquid phase epitaxy growth of HgCdTe layers is typically done around 400 to 550 degrees C, this process is not suitable for HPB CdZnTe.

Another method known in the art for forming P-I-N detectors relies on thermal diffusion. On one side of the CdZnTe substrate, indium is thermally diff-used to form an $N^+$ layer, and on the other side a thin Au layer is deposited to provide a $P^+$ contact. The drawback of this approach is that indium, in addition to being a donor, forms defect complexes which could degrade the energy resolution. Also, detectors fabricated by this process exhibit poor stability.

Accordingly, it is an object of the invention to provide a semiconductor P-I-N detector that has low leakage current and that can operate at room temperature. These and other objects will be apparent from the description that follows.

SUMMARY OF THE INVENTION

Generally speaking, in the present invention a semiconductor P-I-N detector includes a boundary layer for reducing the leakage current within the P-I-N detector. The boundary layer is positioned between a doped layer in the detector and an intrinsic wafer that generates an electrical current as a function of impacting high energy radiation. The boundary layer acts to reduce the diffusion of dopant from the doped layer into the intrinsic wafer. By reducing the diffusion of dopant, the boundary layer also reduces the leakage current within the P-I-N detector.

A multilayer semiconductor P-I-N device for detecting high energy rays, according to the invention, includes an intrinsic wafer, a doped layer overlying the top surface of the intrinsic wafer, an oppositely doped layer overlying the bottom surface of the intrinsic wafer, and a boundary layer. The boundary layer is oriented between one of the doped layer and the intrinsic wafer, such that the boundary layer reduces the diffusion of dopant into the intrinsic wafer. The intrinsic wafer generates an electrical current in response to impacting high energy rays, while the boundary layer reduces the leakage current through the P-I-N detector. The resulting P-I-N detector exhibits good diode behavior with a very low leakage current at room temperature.

The intrinsic wafer is described as having a top surface and a bottom surface, however, the terms "top" and "bottom" are arbitrary terms used simply to assist in describing the structure of the P-I-N detector. The intrinsic wafer can be flipped so that the bottom surface becomes the top surface, and vice versa, without impairing the operation of the P-I-N detector.

In one aspect of the invention, the intrinsic wafer can be formed of CdZnTe crystals or CdTe. Further in accordance with the invention, the doped layers can be formed of compounds selected from groups II and VI of the periodic table of the elements. Preferably, the semiconductor P-I-N detector includes an N-doped layer formed of cadmium sulfide doped with indium, and a P-doped layer formed of zinc telluride doped with copper.

Other aspects of the invention provide for at least one boundary layer formed of compounds selected from groups II and VI of the periodic table of the elements. The boundary layers are preferably formed of II–VI compounds that match the II–VI compounds found in the adjacent doped layer.

Further features of the invention include deposited semiconductor layers within the P-I-N detector. In particular, the material forming the boundary layers and/or the doped layers can be formed of deposited materials. The deposited semiconductor layers form a remarkably accurate P-I-N detector that does not suffer from the performance degradation caused by the high temperature manufacturing methods typically employed in the past.

The process for the fabrication of this P-I-N device includes the steps of providing an intrinsic wafer, forming a semiconductor boundary layer that overlies the top surface of the intrinsic wafer, forming a doped layer overlying the boundary layer, and forming an oppositely doped layer that overlies the bottom surface of the intrinsic wafer.

Another aspect of the invention provides for forming the boundary layer by depositing a layer of semiconductor material onto the intrinsic wafer. Further in accordance with this aspect of the invention, the doped layer adjacent the boundary layer can be formed by doping the surface of the boundary layer with a dopant. The doped layer formed by this process substantially parallels the surface of the underlying semiconductor boundary layer.

DETAILED DESCRIPTION OF THE INVENTION

Figure 1:
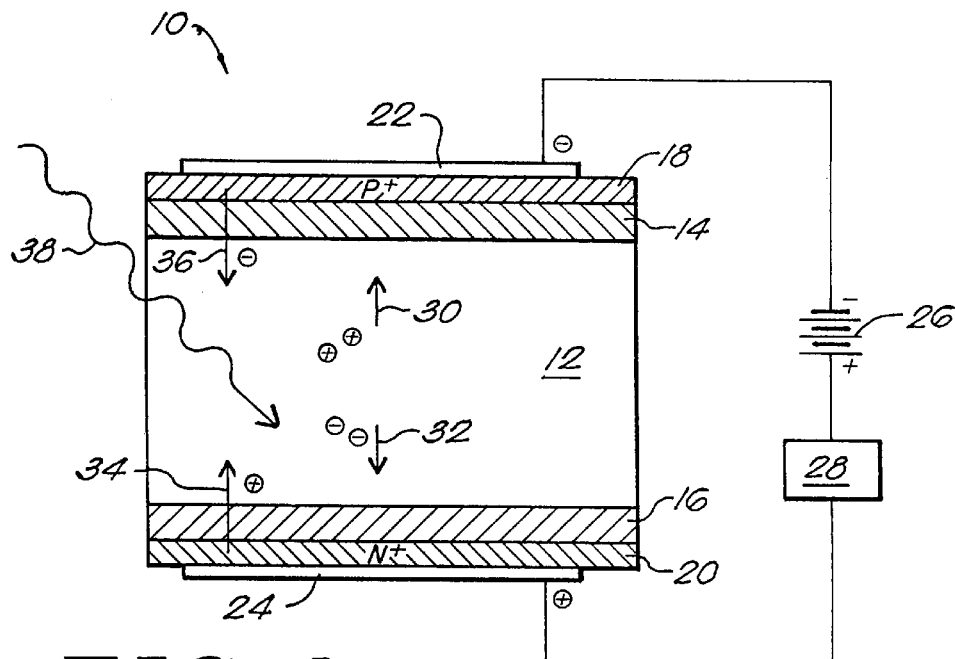
FIG. 1 is a schematic sectional view of the P-I-N design according to the present invention.

FIG. 1 illustrates a semiconductor P-I-N detector 10 according to the invention. The semiconductor P-I-N detector 10 has an intrinsic detector layer 12, an N-doped semiconductor layer 20, and a P-doped semiconductor layer 18. The device shown in FIG. 10 constitutes a P-I-N diode structure. The layer 12 may not be truly intrinsic, but rather may be a high resistivity material of a nominal majority carrier type. In either case, the carrier concentration in the intrinsic wafer 12 is so low that the electric field in the intrinsic wafer 12 is uniform when compared with the electric field in the heavily doped P and N regions 18, 20.

The P-I-N detector shown in FIG. 1 also includes a first boundary layer 14 and a second boundary layer 16. Boundary layer 14 is sandwiched between the intrinsic wafer 12 and the heavily doped P region 18. The second boundary layer 16 is oriented between the intrinsic wafer 12 and the heavily doped N region 20. The boundary layers 14, 16 act to reduce the diffusion of dopant from the heavily doped regions 18, 20, into the intrinsic region 12. For instance, the first boundary layer 14 acts to inhibit the movement of the dopant from region 18 into layer 12, and the second boundary layer 16 inhibits the movement of dopant from the heavily doped region 20 into the intrinsic wafer 12.

The detector shown in FIG. 1 also includes a set of ohmic contacts formed on the doped layers. Ohmic contact 22 is formed on the doped region 18 and a second ohmic contact 24 is formed on the doped region 20. The ohmic contacts provide structure for applying an electric field across the P-I-N diode structure.

A DC voltage source 26 applies a reverse biased voltage across the P-I-N detector 10 through the ohmic contacts 22, 24. For example, the negative terminal of the voltage source 26 applies a negative voltage to the P-doped region 18 through ohmic contact 22. In addition, the voltage source 26 applies a positive charge to the N-doped region 20 through ohmic contact 24. A detector 28 can also be placed in series with the voltage source 26 to detect current changes through the P-I-N diode structure. The current changes detected by the detector 28 indicate changes in high energy beams striking the intrinsic wafer of the P-A-N detector.

The intrinsic wafer 12 can be formed of either cadmium telluride (CdTe) or cadmium zinc telluride (CdZnTe), which have bandgaps of 1.5 and 1.6 electron volts at 300° Kelvin, respectively. The intrinsic wafer 12 ranges from approximately 0.5 millimeter up to approximately 10 millimeters in thickness. Intrinsic wafers formed of CdZnTe prove to be more effective than intrinsic wafers formed of CdTe because CdTe suffers from poor charge collection efficiency, relative to CdZnTe. In CdTe, deep traps reduce the mobility-lifetime product of holes causing long low-energy tails leading to poor energy resolution. The poor charge collection efficiency also limits the effective detection volume for intrinsic wafers formed of CdTe, relative to CdZnTe. Alloying CdTe with Zn increases the resistivity of CdTe and the energy resolution of CdTe. Accordingly, the invention preferably forms an intrinsic wafer 12 from CdZnTe.

The intrinsic wafer 12, as well as the other semiconductor layers 14, 16, 18 and 20, can be formed of either monocrystalline or polycrystalline structures. Polycrystalline structures are preferable because they are frequently cheaper and more easily deposited than single crystalline materials. Thus, while single crystalline materials are to useful in the practice of the present invention, polycrystalline materials are preferred.

Layer 18 is a heavily doped P-region formed that overlies one surface of the intrinsic wafer 12, and layer 20 is a heavily doped N-region that overlies the opposing surface of the intrinsic wafer 12. Both layers 18 and 20 can be formed from compound materials selected from groups II and VI of the periodic table of elements. Preferably, layer 20 is formed from cadmium sulfide and is doped with indium. Layer 18 is preferably formed of zinc telluride and doped with copper. The thickness of the doped layers 18 and 20 can range from approximately 0.25 micrometers up to approximately 0.5 micrometers in thickness. Preferably, the heavily doped P-region 18 is 0.25 micrometers in thickness, and the heavily doped N-region 20 is 0.5 micrometers in thickness.

The first semiconductor boundary layer 14 can be formed from compounds selected from groups II and VI of the periodic table of the elements. The second semiconductor boundary layer 16 can also be formed of elements selected from groups II and VI of the periodic table. Preferably, the boundary layers are formed of the same compound elements used in manufacturing the dopant layers adjacent the boundary layers. That is, boundary layer 14 is preferably formed of the same materials used to manufacture the dopant layer 18, and the boundary layer 16 is formed with the same materials used in producing the dopant layer 20. Note that, in comparison to the doped layers 18 and 20, the boundary layers 14 and 16 remain un-doped. Preferably, boundary layer 14 is formed of zinc telluride and boundary layer 16 is formed of cadmium sulfide. The thickness of the boundary layers can vary from approximately 1.0 micrometers up to approximately 2.0 micrometers.

In operation, a high energy beam of radiation 38, such as a gamma ray, strikes the intrinsic wafer 12. The photons in the ray 38 cause the generation of electron-hole pairs 30, 32 in the intrinsic wafer 12. The photons cause the generation of electron-hole pairs through either photoelectric absorption or Compton scattering. Under suitable electric fields, the electrons 32 and holes 30 are separated and collected at the ohmic contacts 22, 24. Preferably, the semiconductor P-I-N detector 10 has non-injecting ohmic contacts, sufficient recombination lifetime for efficient charge collection, long enough bulk generation lifetime, and damage-free surfaces to minimize thermal and surface leakage currents.

The holes 32 formed by the gamma ray 38 are swept through the P-doped layer 18 and towards the detector 28 along the path indicated by arrow 30. The electrons 32 formed by the gamma ray 38 are swept through the N-doped layer 20 towards the detector 28 along the path shown by arrow 32. The total current through the electrical detector 28 thus varies as a function of the gamma rays impacting the intrinsic wafer 12. Accordingly, the variation in current at detector 28 can be used to detect gamma rays striking the detector 10.

Leakage currents in the P-I-N detector 10 create undesirable affects, including electrical noise in the detector, a reduction of the voltage which can be applied across the detector, a reduction in the charge collection efficiency of the detector, and a reduction in the energy resolution of the detector. A major contributor to the production of leakage currents is the bias voltage applied by the voltage source 26. The bias voltage applied to the detector 10 urges leakage currents to flow from the contacts 22, 24 into the detector layer 12. More specifically, minority electrons are urged to flow from the contact 22 through the P-doped layer 18 and into the detector 12 along path 36. In addition, minority holes are urged to flow from contact 24 through the N-doped layer 20 and into the detector layer 12 along path 34.

The inventors have discovered that leakage current can be reduced by placing a semiconductor boundary layer between one or both of the heavily doped sections 18, 20 and the intrinsic wafer 12. The boundary layer prevents the creation of leakage current paths that can be formed when a dopant from the doped layer diffuses into the intrinsic wafer 12. The boundary layer formed is of sufficient thickness to prevent substantially all of the dopant from diffusing into the intrinsic wafer 12.

The boundary layer 14 is a non-doped region positioned between the heavily doped layer 18 and intrinsic wafer 12. Boundary layer 14 reduces the diffusion of dopant from layer 18 into layer 12, thereby reducing the leakage current of electrons along path 36. The boundary layer 16 is a non-doped layer positioned between the intrinsic wafer 12 and the heavily doped region 20. Boundary layer 16 reduces the diffusion of dopant from layer 20 into layer 12, thereby reducing the leakage current produced by minority carrier holes along path 34.

Figure 2:
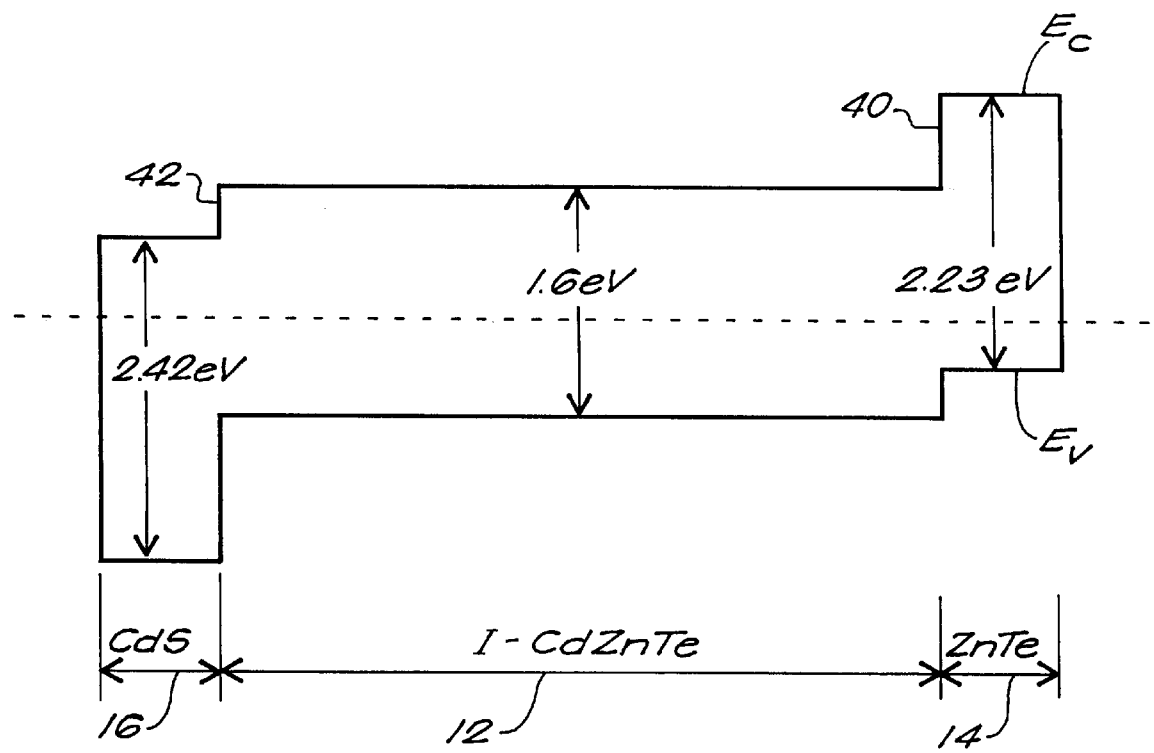
FIG. 2 is an energy band diagram of the detector shown in FIG. 1.

FIG. 2 illustrates an energy diagram of the detector 10. In FIG. 2, $E_c$ is the conduction band edge and $E_V$ is the valence band edge. The bandgap $E_g$ at any point in the diagram is $E_g = E_c - E_V$. Potential barriers are formed between the intrinsic wafer 12 and the boundary layers 14 and 16. The first potential barrier 40 from layer 12 to boundary layer 14 extends upwardly. The upward extension in the potential barrier 40 indicates the direction of increasing force against electron flow. The upward extension of the potential barrier 40 opposes the flow of minority electrons from the layer 14 into the layer 12. A second potential barrier 42 is created at the transition from layer 12 to boundary layer 16. The potential barrier 42 extends downwardly. The downward extension of potential barrier 42 indicates the direction of increasing force against the flow of holes. The downward extension of the potential barrier 42 opposes the flow of minority carrier holes from the layer 16 into the layer 12.

The potential barriers resulting from the addition of the boundary layers 14, 16 create potential barriers not found in the prior art. The first potential barrier 40 has been determined to have a bandgap of approximately 2.23 eV and the second potential barrier 42 has been determined to have a bandgap of approximately 2.42 eV. The potential barriers formed by the boundary layers 14, 16 dramatically reduce the leakage currents flowing through the detector 10.

Figure 3:
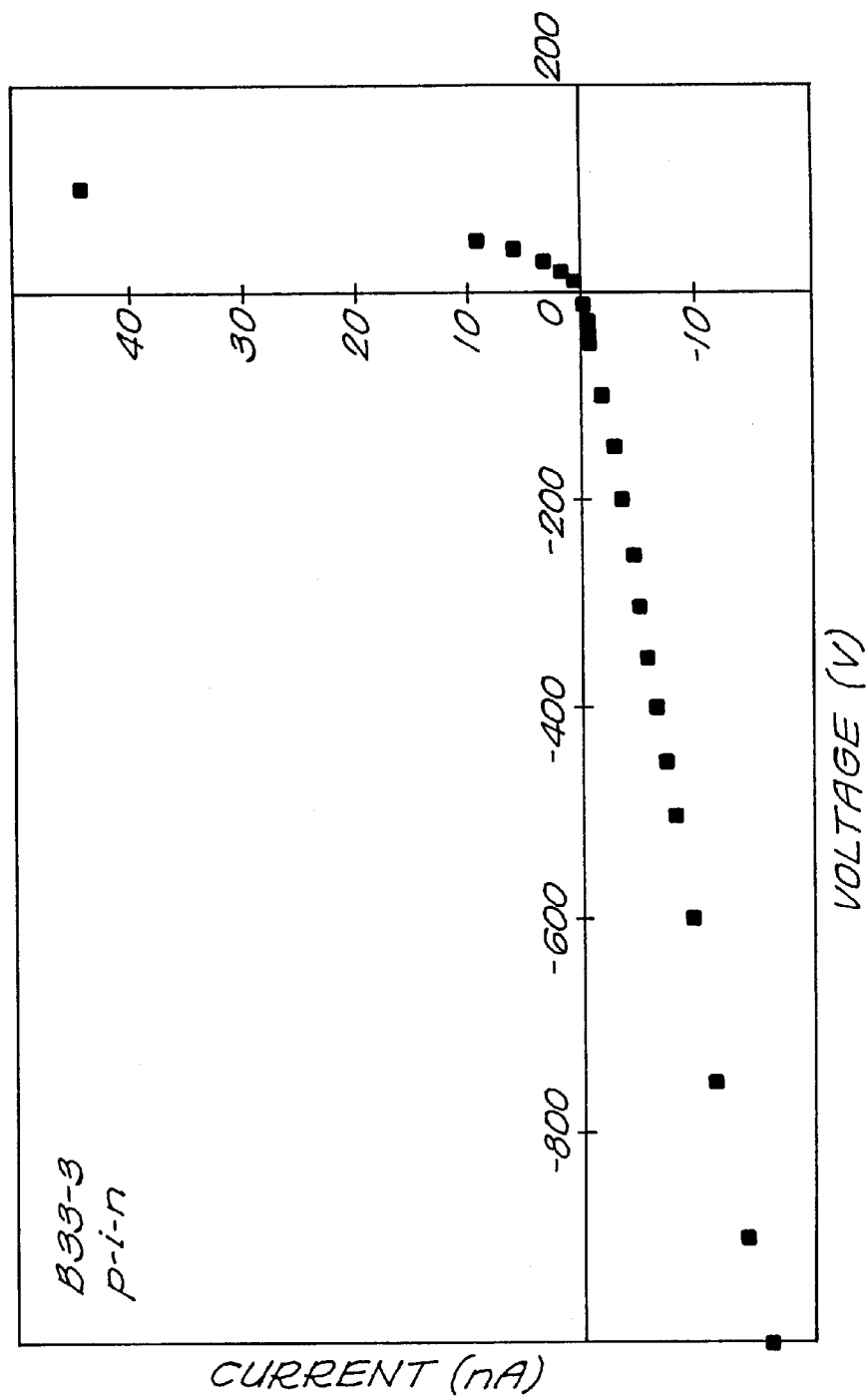
FIG. 3 is a graph of current versus voltage for the detector of FIG. 1.

FIG. 3 illustrates a graph of current versus voltage for the P-I-N detector 10 when the detector was reverse biased with up to 1100 volts. The current and voltage measurements performed on the detector show clear diode-behavior. The graph also illustrates that the P-I-N detector 10 has very low leakage current. In particular, the leakage current of the diode was only 15 nA at 1000 volts. This leakage current is much lower than the leakage current obtained with an MSM device or any known P-I-N device of similar dimensions. Typically, we observe leakage current of 40 nA at 200 volts for MSM devices. These results clearly illustrate the superior leakage current results obtained with the P-I-N detector 10 at high voltages.

FIGS. 4 and 5 illustrate spectral response data for the P-I-N detector 10 when tested at room temperature using high energy radio nuclides and the resulting spectra. These figures clearly show the improved energy resolution and peak to valley ratio for the detector 10.

Figure 4A:
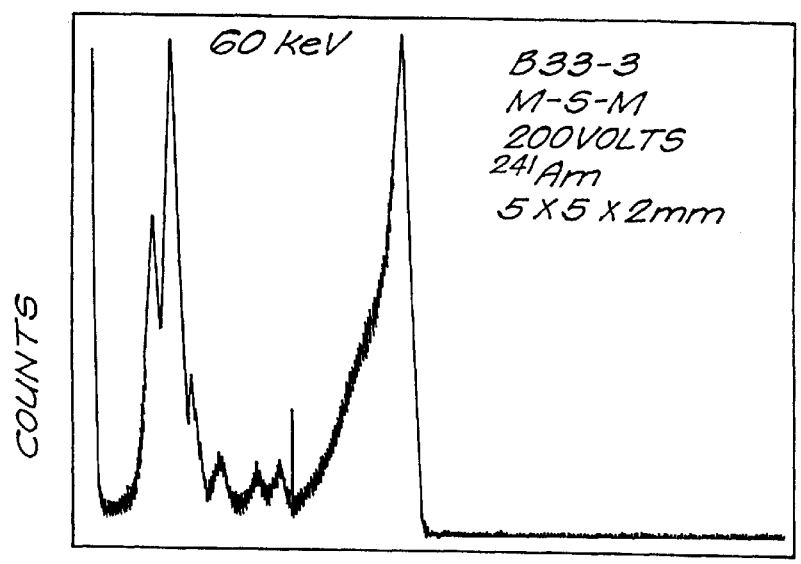
FIG. 4A is a Am spectral response for an MSM detector.
Figure 4B:
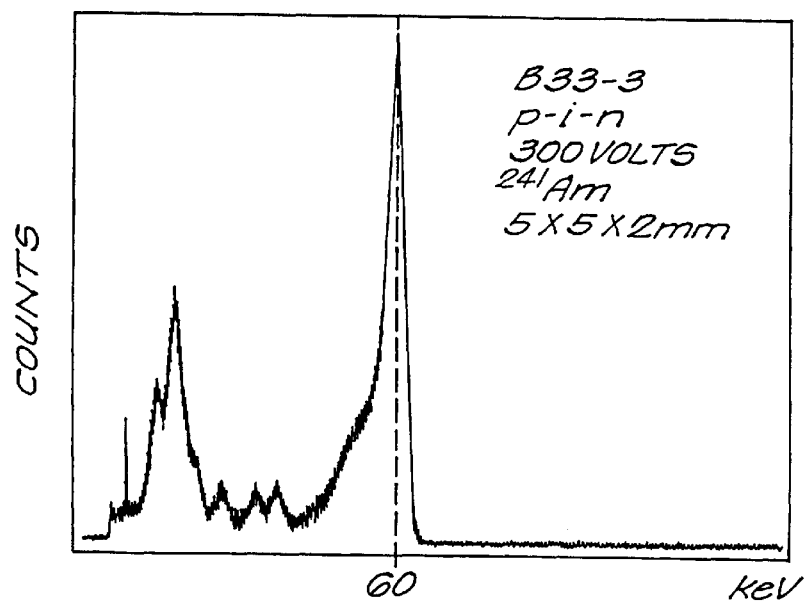
FIG. 4B is a Am spectral response for the detector of FIG. 1.

In particular, FIG. 4A shows the spectral response for an MSM detector at 200 volts when exposed to Am-241 radiation. FIG. 4B shows the spectral response for the P-I-N detector 10 at 300 volts when exposed to Am radiation. The peak in the response for the P-I-N detector at 60 keV represents the primary gamma ray of the Am-241 isotope being detected.

Figure 5A:
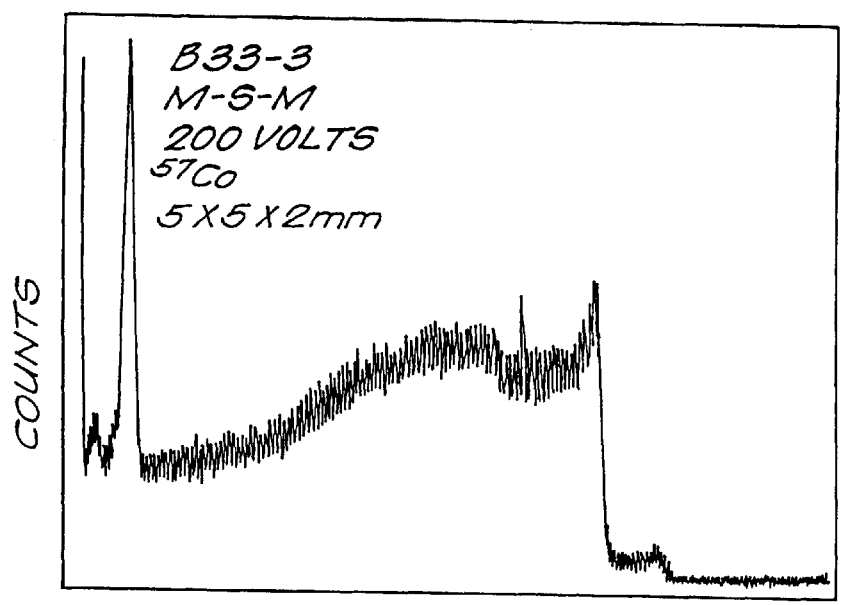
FIG. 5A is a Co spectral response for an MSM detector.
Figure 5B:
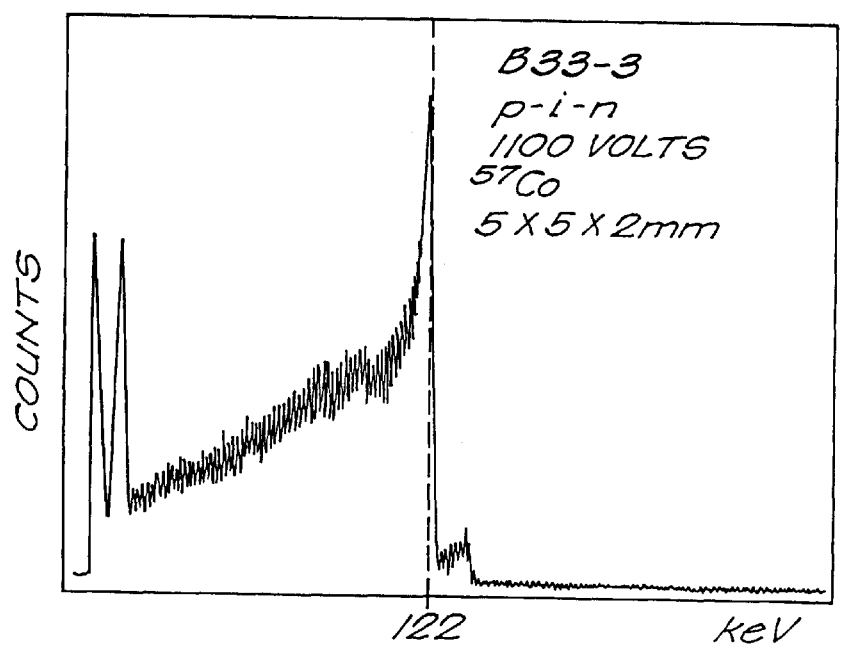
FIG. 5B is a Co spectral response for the detector of FIG. 1.

FIG. 5A shows the spectral response for an MSM detector at 200 volts when exposed to Co-57 radiation. FIG. 5B shows the spectral response for the P-I-N detector 10 at 1100 volts when exposed to Co-57 radiation. The peak in the response for the P-I-N detector at 122 keV represents the primary gamma ray of the Co-57 isotope being detected.

For the MSM detector, the best energy resolution was achieved with a bias voltage of 200 volts; beyond 200 volts of bias voltage the resolution for the MSM detector degraded due to increased leakage current- On the other hand, the energy resolution and peak-to-valley ratio of the P-I-N detector 10 improved at voltages higher than 200 volts due to an enhanced electric field which increases the charge collection efficiency without suffering from additional leakage current. These results clearly demonstrate the improved performance of the P-I-N detector 10, according to the invention.

Figure 6:
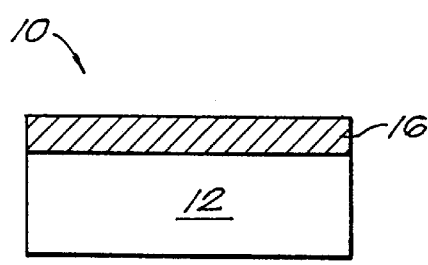
FIGS. 6 through 9 are cross-sectional views illustrating process steps for forming the detector of FIG. 1.

Referring now to FIGS. 6 through 9, the processing steps which may be utilized to produce the semiconductor detector 10 in accordance with the invention will now be described. With reference to FIG. 6, the detector 10 is formed by first providing an intrinsic wafer 12. The intrinsic wafer can be formed of a CdZnTe crystal. The CdZnTe crystals can be grown using a High Pressure Bridgman approach (hereinafter "HPB") or vertical Bridgman approach (hereinafter "VB"). In the HPB approach, crystals are grown near stoichiometry with respect to the metal-chalcogenide ratio, at temperatures near the maximum melting point. The HPB method provides both a favorable growth temperature profile and an exceptionally clean, quartz-free growth enviromnent.

The High Pressure Bridgman technique can be generalized to include the steps whereby cadmium telluride and zinc are loaded into a graphite crucible that in turn is loaded into a steel pressure vessel of a furnace. The temperature and pressure are then raised to 1100° C. and 100 atmospheres, respectively, and maintained for a period of several days while the crystal grows. After the waiting period, the temperature is slowly lowered until the system returns to ambient temperature and pressure, at which time the furnace is unloaded. The entire process can take up to approximately 28 days to complete. After growth of the crystals using the HPB method, the crystals forming the intrinsic wafer 12 may be etched in a 5% bromine/methanol solution to remove surface damage. Typically, those detectors having no internal defects are utilized in the detector 10, while those CdZnTe crystals having internal flaws are either reworked or discarded.

Alternatively, the CdZnTe intrinsic wafer 12 can be purchased commercially. Companies known to market the crystal include Aurora Technologies Corporation of San Diego, Calif.; and EV Products, Division II-VI Company, Saxonburg, Pa.

After obtaining an intrinsic wafer 12, a first semiconductor boundary layer 16 is formed on one surface of the intrinsic wafer 12. The compounds forming the boundary layer 16 are deposited on the intrinsic wafer 12 at a temperature below 150°. Exemplary deposition procedures used to form the boundary layer 16 include electrodeposition, chemical vapor deposition, close spaced sublimation, solid-gas reaction, spray pyrolysis, sputtering, liquid phase epitaxy, molecular beam epitaxy, and other techniques well known in the art.

The deposition process used in forming layer 16 is carried out such that the temperature of the intrinsic wafer 12 does not rise to a level that degrades the detection capabilities of the intrinsic wafer. It is understood by the inventors that once the intrinsic wafer rises above 150° C., the detection capabilities of the intrinsic wafer can be permanently degraded. The boundary layer 16 can be formed on the intrinsic wafer 12 while maintaining a temperature below 150° C., in accordance with the invention, by depositing the compounds in the layer 16 by thermal evaporation. By using thermal evaporation to deposit layer 16, the intrinsic wafer 12 is maintained substantially at 125° C.

Figure 7:
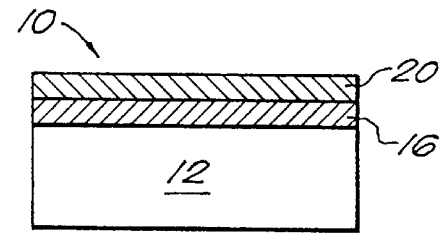

FIG. 7 illustrates the step of forming a doped layer 20 overlying the boundary layer 16. The doped layer 20 is formed by adding dopants to the surface of the boundary layer 16. The doped section formed within layer 16 becomes layer 20. The doped layer 20 extends from the top surface of layer 16 down to a predetermined depth in layer 16. The addition of the dopant to layer 16 forms a doped layer 20 that lies substantially parallel to the top surface of the underlying boundary layer 16. A dopant, such as indium, can be added to the boundary layer 16 through a thermal evaporation process to form the doped layer 20.

Figure 8:
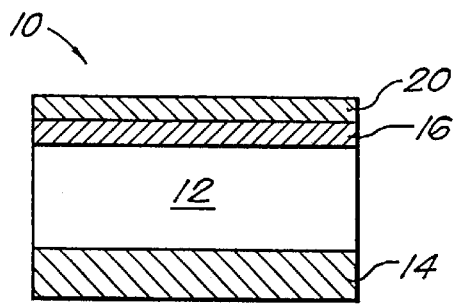

FIG. 8 illustrates the step of forming a second boundary layer 14 on the surface of layer 12 that opposes the boundary layer 16. The compounds forming the second boundary layer 14 are formed on the opposing surface of the intrinsic wafer 12, while maintaining a temperature that does not degrade the detection abilities of the intrinsic wafer 12. Typically, this requires that the boundary layer 14 is formed while maintaining the temperature of the intrinsic wafer at a temperature less than 150° C. The boundary layer 14 can be formed while maintaining a low temperature by forming the layer 14 through a deposition process. Exemplary deposition procedures used to form the boundary layer 14 include electrodeposition, chemical vapor deposition, close spaced sublimation, solid-gas reaction, spray pyrolysis, sputtering, liquid phase epitaxy, molecular beam epitaxy, and other techniques well known in the art.

The boundary layer 14 can be formed on the intrinsic wafer 12 while maintaining a temperature below 150° C., in accordance with the invention, by depositing the compounds in the layer 14 by thermal evaporation. By using thermal evaporation to deposit layer 14, the intrinsic wafer 12 is maintained substantially at 125° C.

Figure 9:
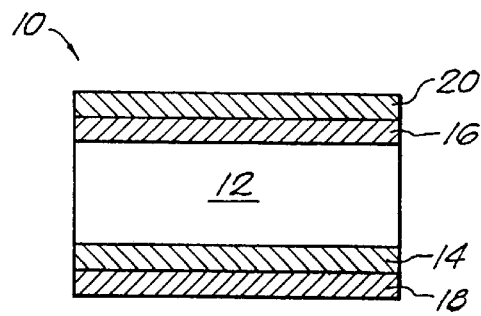

FIG. 9 illustrates the process of forming the doped layer 18 overlying the boundary layer 14. The doped layer 18 is formed by doping the upper surface of the boundary layer 14. The doped section formed within layer 14 becomes layer 18. The doped layer 18 extends from the top surface of layer 14 down to a predetermined depth in layer 14. The addition of the dopant to layer 14 forms a doped layer 18 that lies substantially parallel to the top surface of the underlying boundary layer 14. A dopant, such as copper, can be added to the boundary layer 14 through a thermal evaporation process to form the doped layer 18.

The ohmic contacts 22 and 24 as shown in FIG. 1 can be applied in various ways known in the art. Generally, the ohmic contact 22 that is in conductive contact with the P-type layer 18, is formed from either gold, silver containing epoxy, indium-tin-oxide component or like materials depending upon the intended application. Similarly the ohmic contact 24 that is in conductive contact with the N-type layer 20 may be formed from tin oxide, indium-tin-oxide, or a silver containing epoxy or like materials.

EXAMPLE

For P-I-N fabrication, CdZnTe crystals were grown using a High Pressure Bridgeman method. The crystals grown have a resistivity on the order of $10^{10}$ ohms-cm. Prior to the deposition of the CdS and ZnTe layers onto the CdZnTe layer, the CdZnTe crystals were etched in a bromine methanol solution and samples were immediately transferred to a vacuum evaporation system.

Next, an approximately 1 micron thick CdS layer was deposited on the CdZnTe at a substrate temperature of 125° C. Thereafter, a 0.5 micron thick indium layer was evaporated as a contact layer to the CdS. On the other side of the CdZnTe crystal, an approximately 1 micron thick ZnTe layer was deposited. After the deposition of the ZnTe, the ZnTe layer was doped with copper that extended 0.25 micrometers into the underlying ZnTe boundary layer. Finally, a 0.5 micron thick gold layer was evaporated on the copper doped ZnTe layer as a contact layer. The ZnTe layer was evaporated at a substrate temperature of 100° C.

Other embodiments of the above described P-I-N detector and processes for forming such a structure will be obvious to those skilled in the art. For instance, a plurality of the P-I-N detectors described herein can be utilized in forming pixelated arrays, strip arrays, and coplanar grid arrays. These arrays and grids utilizing P-I-N detector 10 are considered within the scope of the invention. Thus, additions, subtractions, deletions and other modifications of the preferred described embodiments are within the scope of the claims.

Having described the invention, what is claimed as new and secured by Letters Patent is:

1. A multilayer semiconductor P-I-N device for detecting gamma rays, the device comprising:

an intrinsic wafer having a top surface and a bottom surface, the intrinsic wafer generating an electrical current as a function of impacting gamma rays, a non-doped semiconductor boundary layer overlying the top surface of the intrinsic wafer, a doped semiconductor layer overlying the non-doped semiconductor boundary layer, and an oppositely doped semiconductor layer overlying the bottom surface of the intrinsic wafer, wherein the non-doped semiconductor boundary layer positioned between the intrinsic wafer and the doped semiconductor layer reduces the diffusion of dopant into the intrinsic wafer, thereby reducing the leakage current through the P-I-N device.

2. A multilayer semiconductor P-I-N device according to claim 1, further including a second non-doped semiconductor boundary layer positioned between the intrinsic wafer and the oppositely doped semiconductor layer, such that leakage current through the P-I-N device is reduced.

3. A multilayer semiconductor P-I-N device according to claim 2, wherein:

the oppositely doped layer is formed of elements from groups II and VI of the periodic table and an N-type dopant, and the second semiconductor boundary layer is formed of elements from groups II and VI of the periodic table.

4. A multilayer semiconductor P-I-N device according to claim 3, wherein:

the second semiconductor boundary layer is formed of cadmium sulfide, and the oppositely doped layer is formed of cadmium sulfide doped with indium.

5. A multilayer semiconductor P-I-N device according to claim 1, wherein the semiconductor boundary layer has a thickness in the range of approximately 1.0 micrometers to approximately 2.0 micrometers.

6. A multilayer semiconductor P-I-N device according to claim 1, wherein:

the doped layer is formed of elements from groups II and VI of the periodic table and a P-type dopant, and the semiconductor boundary layer is formed of elements from groups to and VI of the periodic table.

7. A multilayer semiconductor P-I-N device according to claim 6, wherein:

the semiconductor boundary layer is formed of zinc telluride, and the doped layer is formed of zinc telluride doped with copper.

8. A multilayer semiconductor P-I-N device according to claim 1, wherein the doped semi conductor layer has a thickness in the range of approximately 0.25 micrometers to approximately 0.5 micrometers.

9. A multilayer semiconductor P-I-N device according to claim 1, wherein the intrinsic wafer includes materials selected from the group consisting of cadmium zinc telluride and cadmium telluride.

10. A multilayer semiconductor P-I-N device according to claim 8, wherein the intrinsic wafer includes cadmium zinc telluride crystals grown by High Pressure Bridgman techniques.

11. A multilayer semiconductor P-I-N device according to claim 1, wherein the intrinsic wafer has a thickness in the range of approximately 0.5 millimeters to approximately 10.0 millimeters.

12. A multilayer semiconductor P-I-N device according to claim 1, wherein the semiconductor boundary layer is formed of material deposited on the intrinsic wafer.

13. A multilayer semiconductor P-I-N device according to claim 12, wherein the oppositely doped semiconductor layer and the doped semiconductor layer are both formed of deposited material.

14. A multilayer semiconductor P-I-N device for detecting high energy rays, the device comprising:

an intrinsic wafer having a bottom surface and a top surface, the intrinsic wafer generating an electrical current as a function of impacting high energy rays, a deposited non-doped semiconductor boundary layer overlying the top surface of the intrinsic wafer, a doped semiconductor layer overlying the non-doped semiconductor boundary layer, and an oppositely doped semiconductor layer deposited on and overlying the bottom surface of the intrinsic wafer, wherein the non-doped semiconductor boundary layer positioned between the intrinsic wafer and the doped semiconductor layer reduces the diffusion of dopant into the intrinsic wafer, thereby reducing the leakage current through the P-I-N device.

\* \* \* \* \*